US008208656B2

(12) United States Patent
Feng et al.

(10) Patent No.: US 8,208,656 B2

(45) Date of Patent: Jun. 26, 2012

(54) ARRAY MICROPHONE SYSTEM INCLUDING OMNI-DIRECTIONAL MICROPHONES TO RECEIVE SOUND IN CONE-SHAPED BEAM

(75) Inventors: Yu-Chun Feng, Taipei (TW); Shien-Neng Lai, Taipei County (TW); Yu-Hsi Lan, Hsinchu County (TW); Ying-Te Chu, Taipei County (TW)

(73) Assignee: Fortemedia, Inc., Sunnyvale, CA (US)

( * ) Notice: Subject to any disclaimer, the term of this patent is extended or adjusted under 35 U.S.C. 154(b) by 433 days.

(21) Appl. No.: 12/489,601

(22) Filed: Jun. 23, 2009

(65) Prior Publication Data

US 2010/0322436 A1 Dec. 23, 2010

(51) Int. Cl.
*H04R 3/00* (2006.01)
*H03G 3/00* (2006.01)
*H03G 7/00* (2006.01)

(52) U.S. Cl. .......... 381/92; 381/122; 381/104; 381/105; 381/106; 381/107

(58) Field of Classification Search .................... 381/92, 381/104–107, 122
See application file for complete search history.

(56) References Cited

U.S. PATENT DOCUMENTS

2003/0053639 A1* 3/2003 Beaucoup et al. .............. 381/92
2006/0002570 A1* 1/2006 Vaudrey et al. ................. 381/92

* cited by examiner

*Primary Examiner* — Devona Faulk
*Assistant Examiner* — George Monikang
(74) *Attorney, Agent, or Firm* — Thomas|Kayden

(57) ABSTRACT

An array microphone system includes a first omni-directional microphone, a second omni-directional microphone, a gain control, and a beam former. The first omni-directional microphone faces a first direction. The second omni-directional microphone faces a second direction opposing the first direction. When receiving sound, the first omni-directional microphone and the second omni-directional microphone respectively generate a first signal and a second signal. The gain control amplifies the second signal to transform into a third signal, wherein strength of the third signal is equal to that of the first signal when the sound comes from the first direction. The beam former separates an in-beam sound signal and an out-beam sound signal from the first signal and the third signal.

8 Claims, 4 Drawing Sheets

ARRAY MICROPHONE SYSTEM INCLUDING OMNI-DIRECTIONAL MICROPHONES TO RECEIVE SOUND IN CONE-SHAPED BEAM

BACKGROUND OF THE INVENTION

1. Field of the Invention

The invention relates to an array microphone system, and more particularly to an array microphone system including two omni-directional microphones to receive sound in a cone-shaped beam.

2. Description of the Related Art

A microphone array is capable of clearly receiving sound from a particular direction while excluding surrounding noise, and is often applied in high-quality audio recorders or communications devices.

FIG. 1 depicts a conventional microphone array 70 including a uni-directional microphone (main microphone) 710 and an omni-directional microphone (reference microphone) 720. A cone-shaped beam 730 is defined in front of the uni-directional microphone 710. The microphone array 70 utilizes the sensitivity difference between the uni-directional microphone 710 and the omni-directional microphone 720 to exclude surrounding noise (i.e. the sound outside the beam 730).

The microphone array 70 functions very well. However, the uni-directional microphone 710 included in the microphone array 70 has the problems of being difficult to manufacture because of its design and high costs.

FIG. 2 depicts another conventional microphone array 80 including two omni-directional microphones 810 and 820. A pie-shaped beam 830 is defined at the front and the rear of the microphone array 80. The microphone array 80 utilizes the phase delay of the sound received by the two omni-directional microphones 810 and 820 to exclude surrounding noise (i.e. the sound outside the beam 830).

The microphone array 80 has no uni-directional microphones and thus, does not have the accompanying problems of uni-directional microphones. However, sounds coming from the rear of the microphone array 80 can not be excluded due to the pie-shaped beam 830. Thus, limiting actual application of the microphone array 80 to less than that of the microphone array 70.

BRIEF SUMMARY OF THE INVENTION

The invention provides an array microphone system including two omni-directional microphones to receive sound in a cone-shaped beam, thus avoiding the described problems. The array microphone system in accordance with an exemplary embodiment of the invention includes a first omni-directional microphone, a second omni-directional microphone, a gain control, and a beam former. The first omni-directional microphone faces a first direction. The second omni-directional microphone faces a second direction opposing the first direction. When receiving sound, the first omni-directional microphone and the second omni-directional microphone respectively generate a first signal and a second signal. The gain control amplifies the second signal to transform into a third signal, wherein strength of the third signal is equal to that of the first signal when the sound comes from the first direction. The beam former separates an in-beam sound signal and an out-beam sound signal from the first signal and the third signal.

In another exemplary embodiment, the array microphone system further includes a first voice activity detector and a second voice activity detector controlling an operation of the beam former based on the first signal and the third signal.

In yet another exemplary embodiment, the operation of the first voice activity detector and the second voice activity detector is mutually exclusive.

The invention also provides a method for determining a gain of a gain control. The method in accordance with an exemplary embodiment of the invention includes the steps of: first, setting a first omni-directional microphone and a second omni-directional microphone in different positions; second, generating a first sound from a first direction; third, obtaining a first ratio of a first signal from the first omni-directional microphone to a second signal from the second omni-directional microphone; fourth, generating a second sound from a second direction opposing the first direction when the first ratio of the first signal to the second signal exceeds a first predetermined value; fifth, obtaining a second ratio of a third signal from the second omni-directional microphone to a fourth signal from the first omni-directional microphone; and sixth, setting the first ratio as the gain when the second ratio of the third signal to the fourth signal exceeds a second predetermined value.

In another exemplary embodiment, the method for determining a gain of a gain control further includes the step of resetting the first omni-directional microphone and the second omni-directional microphone in different positions when the first ratio of the first signal to the second signal does not exceed the first predetermined value.

In yet another exemplary embodiment, the method for determining a gain of a gain control further includes the step of resetting the first omni-directional microphone and the second omni-directional microphone in different positions when the second ratio of the third signal to the fourth signal does not exceed the second predetermined value.

The invention also provides a method for determining a gain of a gain control. The method in accordance with an exemplary embodiment of the invention includes the steps of: first, setting a first omni-directional microphone and a second omni-directional microphone in different positions; second, generating a first sound from a first direction; third, obtaining a first ratio of a first signal from the first omni-directional microphone to a second signal from the second omni-directional microphone; fourth, generating a second sound from a second direction opposing the first direction when the first ratio of the first signal to the second signal exceeds a first predetermined value; fifth, obtaining a second ratio of a third signal from the second omni-directional microphone to a fourth signal from the first omni-directional microphone; sixth, generating third sound from a third direction perpendicular to the first direction and the second direction when the second ratio of the third signal to the fourth signal exceeds the second predetermined value; seventh, obtaining a third ratio of a fifth signal from the second omni-directional microphone to a sixth signal from the first omni-directional microphone; and eighth, setting the first ratio as the gain when the third ratio of the fifth signal to the sixth signal exceeds a third predetermined value.

In another exemplary embodiment, the method for determining a gain of a gain control further includes the step of resetting the first omni-directional microphone and the second omni-directional microphone in different positions when the first ratio of the first signal to the second signal does not exceed the first predetermined value.

In yet another exemplary embodiment, the method for determining a gain of a gain control further includes the step of resetting the first omni-directional microphone and the second omni-directional microphone in different positions when the second ratio of the third signal to the fourth signal does not exceed the second predetermined value.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
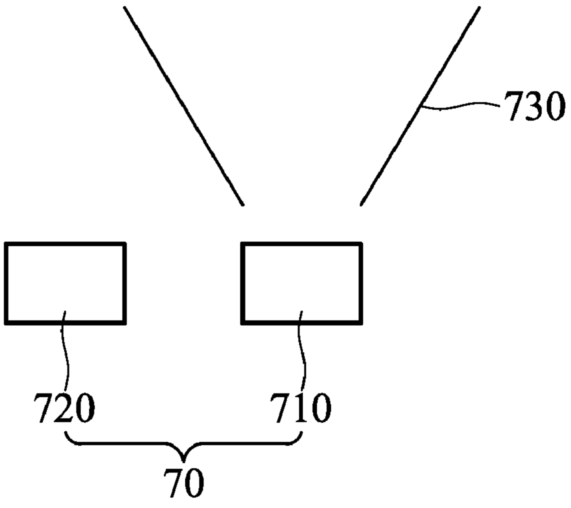
FIG. 1 (PRIOR ART)
FIG. 1 depicts a conventional microphone array including a uni-directional microphone and an omni-directional microphone.
Figure 2:
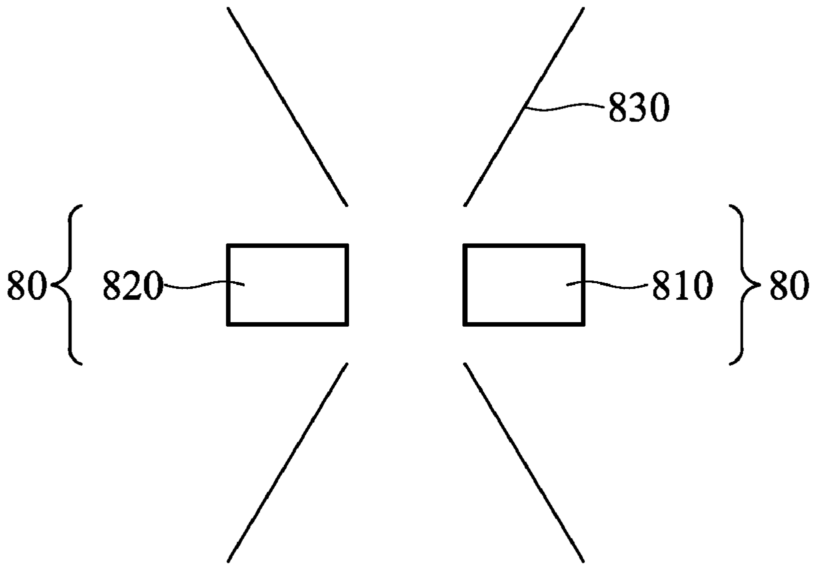
FIG. 2 (PRIOR ART)
FIG. 2 depicts another conventional microphone array including two omni-directional microphones.
Figure 3:
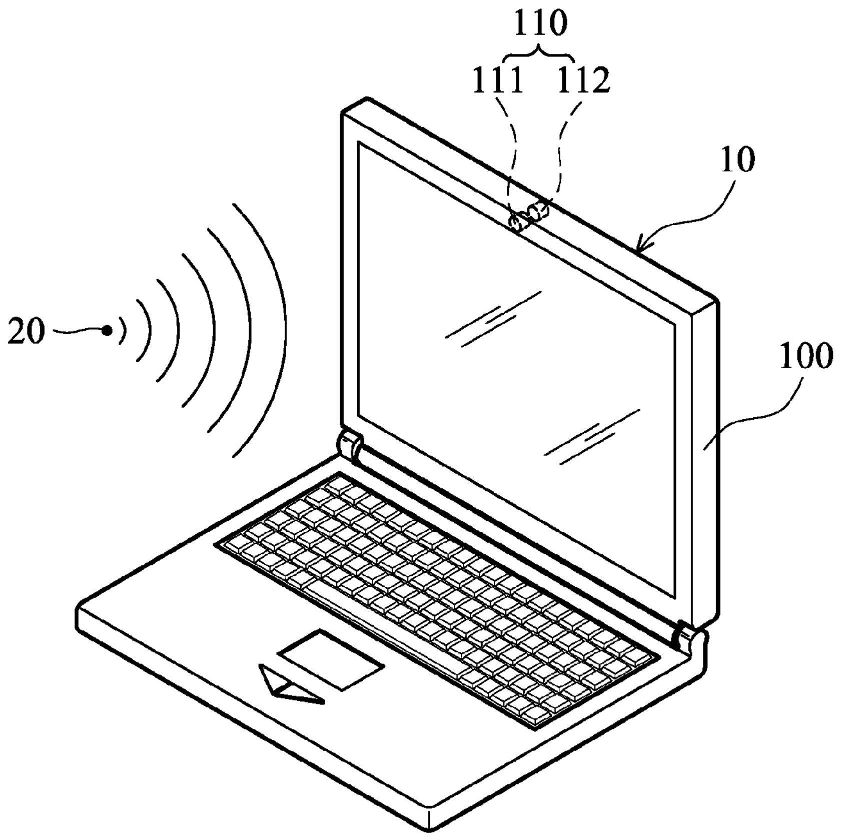
FIG. 3 depicts an electronic device containing an array microphone system in accordance with an embodiment of the invention.

Referring to FIG. 3, an electronic device 10 has a body 100 in which an array microphone system 110 is provided to receive external sound 20. The array microphone system 110 includes a main microphone 111 facing the front and a reference microphone 112 facing the rear. Both the main microphone 111 and the reference microphone 112 are omni-directional microphones.

Figure 4:
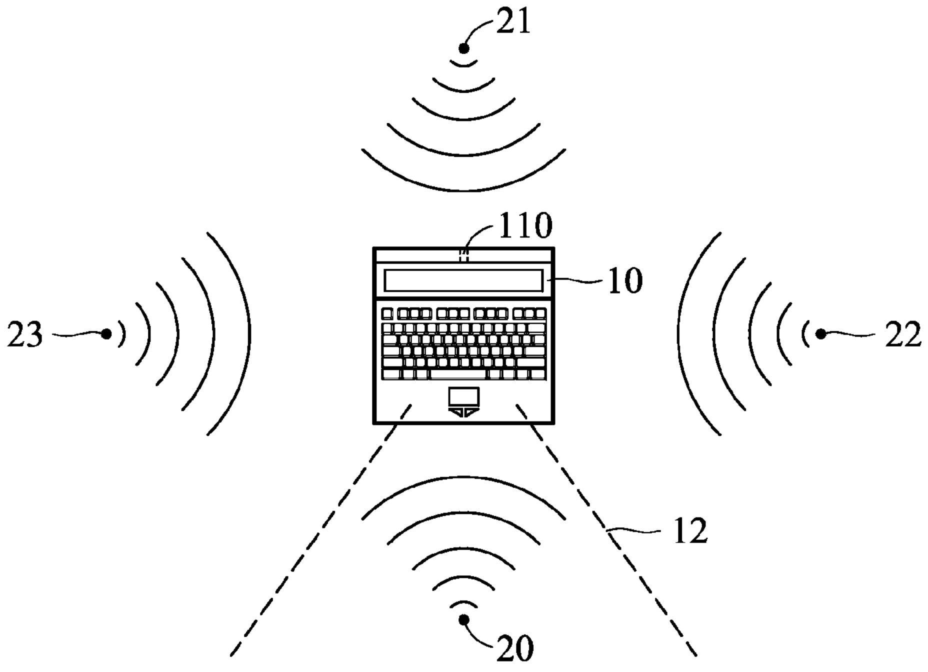
FIG. 4 is a top view of the electronic device of FIG. 3.

Referring to FIG. 4, the array microphone system 110 defines a cone-shaped beam 12 in front of the electronic device 10. Sound 20 in the beam 12 (hereinafter in-beam sound) is desirable, and sound 21, 22, and 23 outside the beam 12 (hereinafter out-beam sound) is undesirable. During the operation of the array microphone system 110, the in-beam sound, out-beam sound, or both may be generated. The array microphone system 110 is capable of distinguishing the received sound and separately outputting an in-beam sound signal and an out-beam sound signal.

Figure 5:
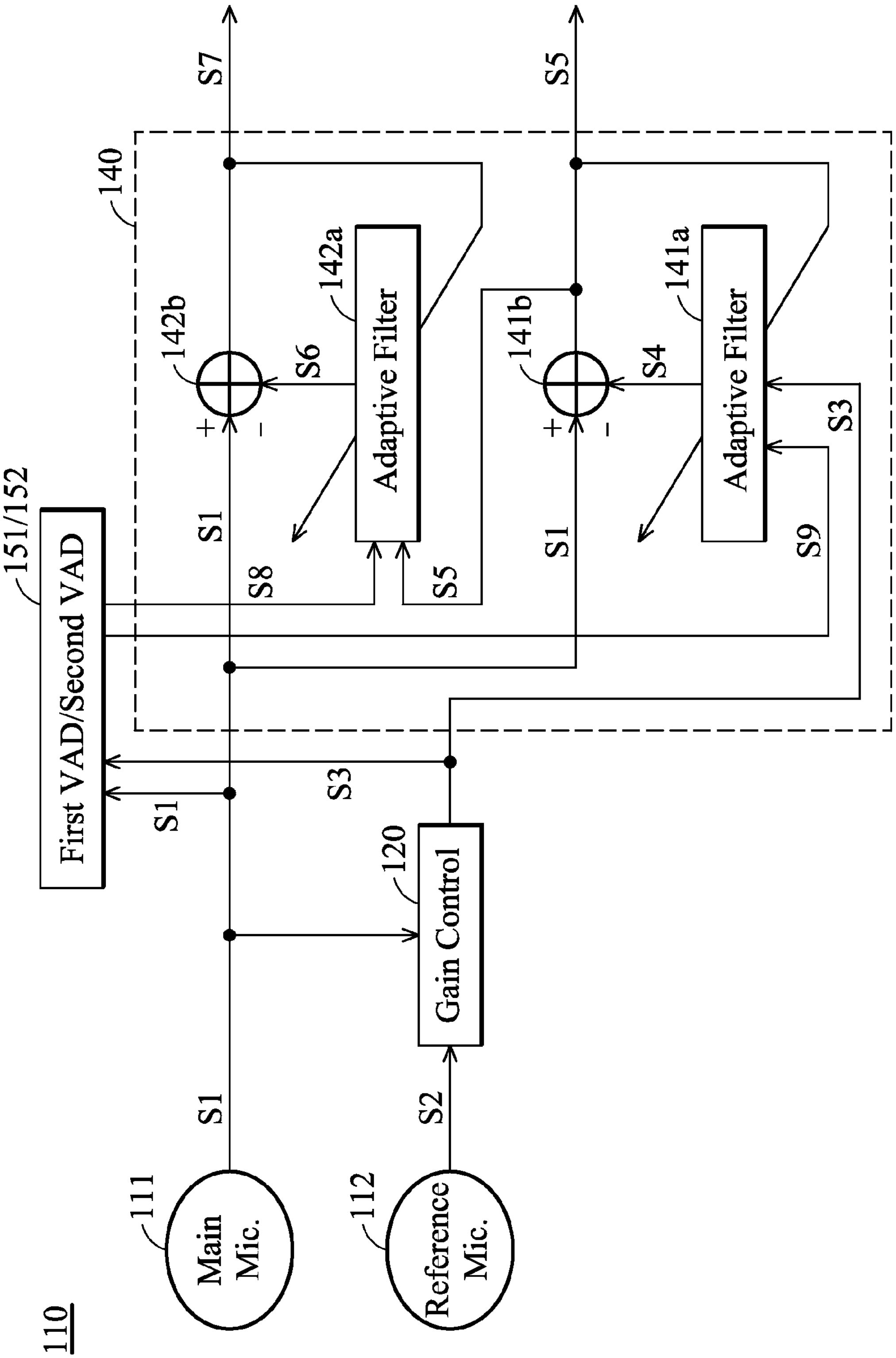
FIG. 5 is a block diagram of the array microphone system in accordance with an embodiment of the invention.

Referring to FIG. 5, in operation, the main microphone 111 and the reference microphone 112 receive in-beam sound and/or out-beam sound. The main microphone 111 generates a signal S1 corresponding to the received sound and sends it to a first voice activity detector (VAD) 151, a second voice activity detector (VAD) 152, and a beam former 140. Also, the reference microphone 111 generates a signal S2 corresponding to the received sound and sends it to a gain control 120. In this embodiment, the gain control 120 is a gain amplifier, amplifying the strength (voltage) of the signal S2 and obtaining an amplified signal S3 output to the first VAD 151, the second VAD 152, and the beam former 140.

The first VAD 151 and the second VAD 152 receives the signals S1 and S3 from the main microphone 111 and the gain control 120, and provides voice detection signals S8 and S9 corresponding to the received sound for controlling the operation of the beam former 140. The operation of the first VAD 151 and that of the second VAD 152 are mutually exclusive. If the first VAD 151 is on, then the second VAD 152 will be off. On the other hand, the first VAD 151 will be off if the second VAD 152 is on. When the in-beam sound 20 is received by the array microphone system 110, the first VAD 151 is on and the second VAD 152 is off. When there is no in-beam sound 20 but out-beam sound 21, 22, or 23, the first VAD 151 is off and the second VAD 152 is on.

The beam former 140 receives the signal S1 from the main microphone 111, the amplified signal S3 from the gain control 120, and the voice detection signals S8 and S9 from the first VAD 151 and the second VAD 152, and separates an in-beam sound signal S7 and an out-beam sound signal S5 from the signal S1 and the amplified signal S3.

The operation of the array microphone system 110 is introduced in detail in the following three cases:

In the first case, there is no out-beam sound 21, 22, and 23, and the array microphone system 110 only receives the in-beam sound 20. The main microphone 111 and the reference microphone 112 respectively generate signals S1 and S2, both of which correspond to the in-beam sound 20. Because the in-beam sound 20 comes from the front and the reference microphone 112 faces the rear, the signal S2 generated by the reference microphone 112 is much weaker than the signal S1 generated by the main microphone 111 (S2<<S1). The gain control 120 amplifies the signal S2 and outputs an amplified signal S3 wherein S3≈S1.

The first VAD 151 and the second VAD 152 receives the signals S1 and S3 from the main microphone 111 and the gain control 120. After calculation, the first VAD 151 is on and the second VAD 152 is off. The first VAD 151 outputs voice detection signals S8 and S9 to the beam former 140.

In the beam former 140, an adaptive filter 141*a* receives the amplified signal S3 from the gain control 120, the voice detection signal S9 from the first VAD 151, and a feedback signal S5 from a summer 141*b*, calculates the parameters for the linear correlation between the signals S1 and S3, and provides a filtered signal S4 which is approximately equal to the amplified S3 (i.e. S4≈S3). As described, S3≈S1. Thus, S4≈S1. The signal S4 is then subtracted from the signal S1 by the summer 141*b* to obtain a signal S5. The signal S5 is very small (≈0) because S1≈S4, which is reasonable because the signal S5, as described, corresponds to the out-beam sound. In the first case, there is no out-beam sound.

Another adaptive filter 142*a* receives the signal S5 from the summer 141*b*, the voice detection signal S8 from the first VAD 151, and a feedback signal S7 from a summer 142*b*, calculates the parameters for the linear correlation between the signals S1 and S5, and provides a signal S6. Because the signal S5 input to the adaptive filter 142*a* is very small, the signal S6 output from the adaptive filter 142*a* is very small. That is, S6≈0. The signal S6 is then subtracted from the signal S1 by the summer 142*b* to obtain a signal S7. The signal S7, corresponding to the in-beam sound 20, is approximately equal to the signal S1 (S7≈S1) because S6≈0.

In the first case, the array microphone system 110 only receives the in-beam sound 20, and separately outputs two signals S7 and S5, wherein the signal S7 corresponds to the in-beam sound 20 and the signal S5 corresponding to the out-beam sound is very small.

In the second case, there is no in-beam sound 20, and the array microphone system 110 receives out-beam sound 21, 22, and/or 23. For simplification, there is only the out-beam sound 21 coming from the rear. The main microphone 111 and the reference microphone 112 respectively generate signals S1 and S2, both of which correspond to the out-beam sound 21. Because the out-beam sound 21 comes from the rear and the main microphone 111 faces the front, the signal S1 generated by the main microphone 111 is much weaker than the signal S2 generated by the reference microphone 112 (S1<<S2). The gain control 120 amplifies the signal S2 and outputs an amplified signal S3 wherein S3>S2. Note that S3>>S1 because S2>>S1.

The first VAD 151 and the second VAD 152 receives the signals S1 and S3 from the main microphone 111 and the gain control 120. After calculation, the first VAD 151 is off and the second VAD 152 is on. The second VAD 152 outputs the voice detection signals S9 and S8 to the beam former 140.

In the beam former 140, an adaptive filter 141*a* receives the amplified signal S3 from the gain control 120, the voice detection signal S9 from the second VAD 152, and a feedback signal S5 from the summer 141*b*, calculates the parameters for the linear correlation between the signals S1 and S3, and provides a filtered signal S4. Note that the signal S4, deriving from the signal S3, is much greater than the signal S1 because S3>>S1. The signal S4 is then subtracted from the signal S1 by the summer 141*b* to obtain a signal S5 corresponding to the out-beam sound 21.

The adaptive filter 142*a* receives the signal S5 from the summer 141*b* and the voice detection signal S8 from the second VAD 152, calculates the parameters for the linear correlation between the signals S1 and S5, and provides a signal S6 which is approximately equal to the signal S1. The signal S6 is then subtracted from the signal S1 by the summer 142*b* to obtain a signal S7. The signal S7 corresponding to the in-beam sound is very small (S7≈0) because S6≈S1.

In the second case, the array microphone system 110 only receives the out-beam sound, and separately outputs two signals S7 and S5, wherein the signal S7 corresponding to the in-beam sound is very small and the signal S5 corresponds to the out-beam sound.

In the third case, the array microphone system 110 simultaneously receives the in-beam sound 20 from the front and the out-beam sound 21 from the rear. The main microphone 111 and the reference microphone 112 generate signals S1 and S2, respectively. The signal S1 generated by the main microphone 111 contains an in-beam part and an out-beam part. Because the out-beam sound 21 comes from the rear and the main microphone 111 faces the front, the out-beam part of the signal S1 is small. Similarly, the signal S2 generated by the reference microphone 112 contains an in-beam part and an out-beam part. Because the in-beam sound 20 comes from the front and the reference microphone 112 faces the rear, the in-beam part of the signal S2 is small. The signal S2 is then amplified by the gain control 120 into a signal S3 wherein the in-beam part of the amplified signal S3 is approximately equal to that of the signal S1.

The first VAD 151 and the second VAD 152 receive the signals S1 and S3 from the main microphone 111 and the gain control 120. After calculation, the first VAD 151 is on and the second VAD 152 is off. The first VAD 151 outputs the voice detection signals S9 and S8 to the beam former 140.

In the beam former 140, the adaptive filter 141*a* receives the amplified signal S3 from the gain control 120, the voice detection signal S9 from the first VAD 151, and a feedback signal S5 from the summer 141*b*, calculates the parameters for the linear correlation between the signals S1 and S3, and provides a filtered signal S4, wherein the in-beam part of the filtered signal S4 is approximately equal to that of the signal S1. The filtered signal S4 is then subtracted from the signal S1 by the summer 141*b* to cancel out the in-beam part and obtain a sound signal S5 corresponding to the out-beam sound 21.

The adaptive filter 142*a* receives the signal S5 from the summer 141*b*, the voice detection signal S8 from the first VAD 151, and the feedback signal S7 from the summer 142*b*, calculates the parameters for the linear correlation between the signals S1 and S5, and provides a filtered signal S6 which is approximately equal to the out-beam part of the signal S1. The signal S6 is then subtracted from the signal S1 by the summer 142*b* to cancel out the out-beam part and obtain a sound signal S7 corresponding to the in-beam sound 20.

In the third case, the array microphone system 110 simultaneously receives the in-beam sound 20 and the out-beam sound 21, and separately outputs two signals S7 and S5, wherein the signal S7 corresponds to the in-beam sound 20 and the signal S5 corresponds to the out-beam sound 21.

Figure 6:
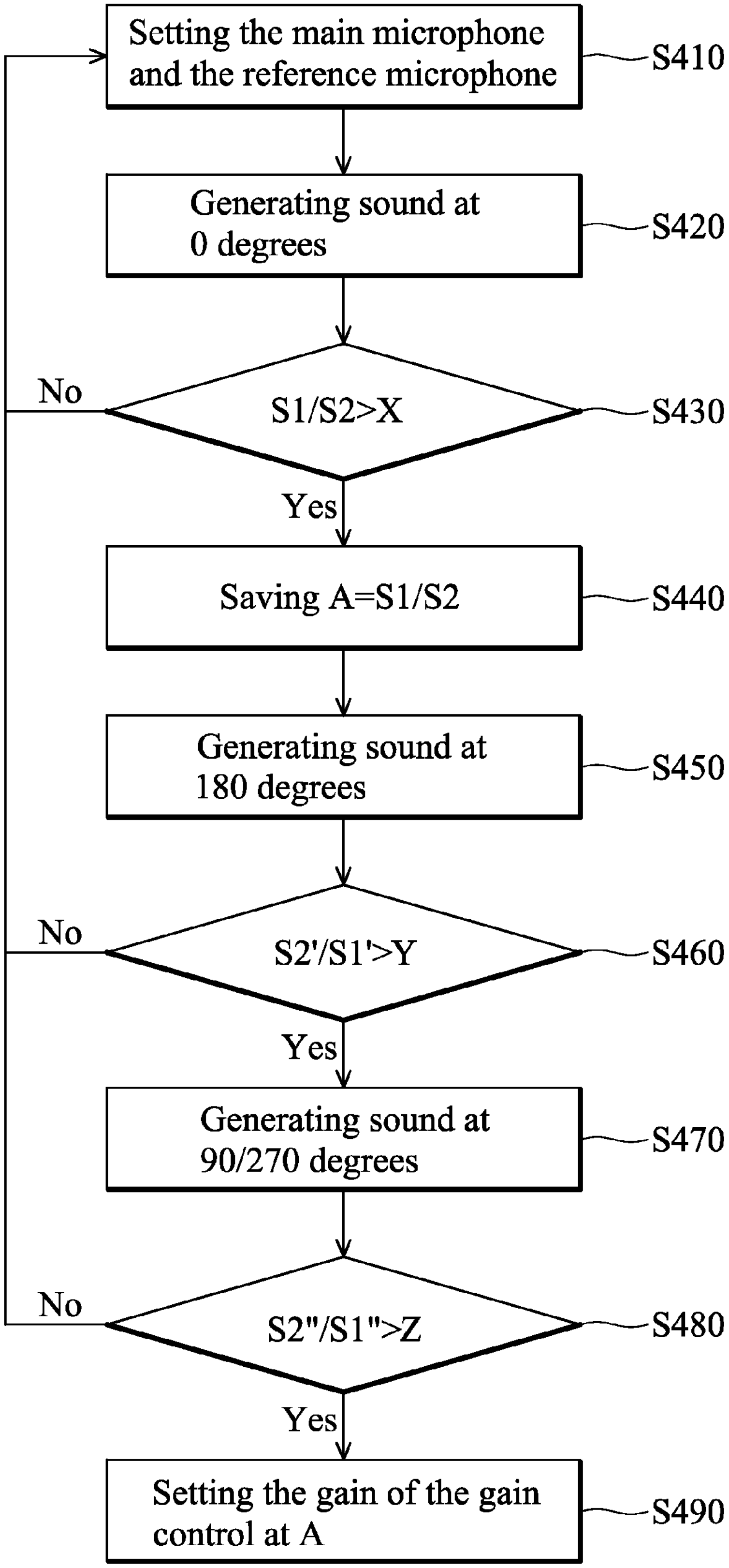
FIG. 6 is a flow chart of determining the positions of the main microphone and the reference microphone and the gain of the gain control of the array microphone system in accordance with an embodiment of the invention.

FIG. 6 is a flow chart of determining the positions of the main microphone 111 and the reference microphone 112 and the gain of the gain control 120. In step S410, the main microphone 111 and the reference microphone 112 are set in different positions. For example, the main microphone 111 and the reference microphone 112 are disposed back-to-back, wherein the main microphone 111 faces the front and the reference microphone 112 faces the rear. In step S420, sound is generated from the front (or at 0°). The main microphone 111 and the reference microphone 112 receive the sound, and respectively provide a first signal S1 and a second signal S2. In Step S430, the ratio of the strength of the first signal S1 to that of the second signal S2 is calculated. If S1/S2>X (a predetermined empirical value), then step S440 is executed. If S1/S2≦X, then step S410 is executed to reset the positions of the main microphone 111 and the reference microphone 112. In step S440, the ratio S1/S2 is set as A and saved. In step S450, sound is generated from the rear (or at 180°). The main microphone 111 and the reference microphone 112 receive the sound, and respectively provide a fourth signal S1' and a third signal S2'. In Step S460, the ratio of the strength of the third signal S2' to that of the fourth signal S1' is calculated. If S2'/S1'>Y (another predetermined empirical value), then step S470 is executed. If S2'/S1'≦Y, then step S410 is executed to reset the positions of the main microphone 111 and the reference microphone 112. In step S470, sound is generated from the side (at 90° or 270°). The main microphone 111 and the reference microphone 112 receive the sound, and respectively provide a sixth signal S1" and a fifth signal S2". In Step S480, the ratio of the strength of the fifth signal S2" to that of the sixth signal S1" is calculated. If S2"/S1">Z (another predetermined empirical value), then step S490 is executed. If S2"/S1"≦Z, then step S410 is executed to reset the positions of the main microphone 111 and the reference microphone 112. In step S490, the ratio A is set as the gain of the gain control 120.

However, step S470 and step S480 can be omitted. That is, if S2'/S1'>Y (step S460), then the ratio A is set as the gain of the gain control 120 (step S490).

As described, the array microphone system 110 includes two omni-directional microphones 111 and 112 to receive sound in a cone-shaped beam 12, thus avoiding the previously mentioned problems of conventional array microphones.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An array microphone system, comprising:

a first omni-directional microphone facing a first direction, wherein the first omni-directional microphone generates a first signal when receiving sound;

a second omni-directional microphone facing a second direction opposing the first direction, wherein the second omni-directional microphone generates a second signal when receiving the sound;

a gain control amplifying the second signal into a third signal, wherein strength of the third signal is equal to that of the first signal when the sound comes from the first direction;

a beam former separating an in-beam sound signal and an out-beam sound signal from the first signal and the third signal; and a first voice activity detector and a second voice activity detector controlling an operation of the beam former based on the first signal and the third signal.

2. The array microphone system as claimed in claim 1, wherein operation of the first voice activity detector and the second voice activity detector is mutually exclusive.

3. A method for determining a gain of a gain control, comprising:

setting a first omni-directional microphone and a second omni-directional microphone in different positions;

generating a first sound from a first direction;

obtaining a first ratio of a first signal from the first omni-directional microphone to a second signal from the second omni-directional microphone;

generating a second sound from a second direction opposing the first direction when the first ratio of the first signal to the second signal exceeds a first predetermined value;

obtaining a second ratio of a third signal from the second omni-directional microphone to a fourth signal from the first omni-directional microphone; and setting the first ratio as the gain when the second ratio of the third signal to the fourth signal exceeds a second predetermined value.

4. The method for determining a gain of a gain control as claimed in claim 3, further comprising resetting the first omni-directional microphone and the second omni-directional microphone in different positions when the first ratio of the first signal to the second signal does not exceed the first predetermined value.

5. The method for determining a gain of a gain control as claimed in claim 3, further comprising resetting the first omni-directional microphone and the second omni-directional microphone in different positions when the second ratio of the third signal to the fourth signal does not exceed the second predetermined value.

6. A method for determining a gain of a gain control, comprising:

setting a first omni-directional microphone and a second omni-directional microphone in different positions;

generating a first sound from a first direction;

obtaining a first ratio of a first signal from the first omni-directional microphone to a second signal from the second omni-directional microphone;

generating a second sound from a second direction opposing the first direction when the first ratio of the first signal to the second signal exceeds a first predetermined value;

obtaining a second ratio of a third signal from the second omni-directional microphone to a fourth signal from the first omni-directional microphone;

generating third sound from a third direction perpendicular to the first direction and the second direction when the second ratio of the third signal to the fourth signal exceeds the second predetermined value;

obtaining a third ratio of a fifth signal from the second omni-directional microphone to a sixth signal from the first omni-directional microphone; and setting the first ratio as the gain when the third ratio of the fifth signal to the sixth signal exceeds a third predetermined value.

7. The method for determining a gain of a gain control as claimed in claim 6, further comprising resetting the first omni-directional microphone and the second omni-directional microphone in different positions when the first ratio of the first signal to the second signal does not exceed the first predetermined value.

8. The method for determining a gain of a gain control as claimed in claim 6, further comprising resetting the first omni-directional microphone and the second omni-directional microphone in different positions when the second ratio of the third signal to the fourth signal does not exceed the second predetermined value.

* * * * *